United States Patent
Kim

(10) Patent No.: US 8,327,219 B2
(45) Date of Patent: Dec. 4, 2012

(54) METHOD, APPARATUS AND COMPUTER PROGRAM PRODUCT PROVIDING SOFT ITERATIVE RECURSIVE LEAST SQUARES (RLS) CHANNEL ESTIMATOR

(75) Inventor: Kyeong Jin Kim, Irving, TX (US)

(73) Assignee: Core Wireless Licensing S.A.R.L., Luxembourg (LU)

( * ) Notice: Subject to any disclaimer, the term of this patent is extended or adjusted under 35 U.S.C. 154(b) by 0 days.

(21) Appl. No.: 13/292,540

(22) Filed: Nov. 9, 2011

(65) Prior Publication Data
US 2012/0054577 A1    Mar. 1, 2012

Related U.S. Application Data

(62) Division of application No. 11/804,239, filed on May 16, 2007, now Pat. No. 8,060,803.

(60) Provisional application No. 60/801,037, filed on May 16, 2006.

(51) Int. Cl.
*H03M 13/00* (2006.01)
(52) U.S. Cl. ......... 714/755; 714/758; 714/799; 375/340
(58) Field of Classification Search .................. 714/752, 714/755, 758, 799; 365/340; 375/340
See application file for complete search history.

(56) References Cited

U.S. PATENT DOCUMENTS

| | | | | |
|---|---|---|---|---|
| 6,757,337 B2* | 6/2004 | Zhuang et al. | ................ | 375/267 |
| 7,212,579 B2 | 5/2007 | Claussen et al. | ................ | 375/267 |
| 7,418,051 B2* | 8/2008 | Kramer et al. | ................ | 375/265 |
| 7,562,280 B2* | 7/2009 | Eroz et al. | ................ | 714/755 |
| 7,751,506 B2* | 7/2010 | Niu et al. | ................ | 375/341 |
| 2005/0193320 A1 | 9/2005 | Varnica et al. | ................ | 714/800 |
| 2007/0086539 A1 | 4/2007 | Hocevar | ................ | 375/267 |
| 2007/0127603 A1 | 6/2007 | Nui et al. | ................ | 375/341 |
| 2007/0286313 A1 | 12/2007 | Nikopour-Deilami et al. | ................ | 375/341 |
| 2007/0297496 A1 | 12/2007 | Park et al. | ................ | 375/148 |

OTHER PUBLICATIONS

K. J. Kim, T. Reid, and R.A. Iltis, "Soft Iterative Data Detection for Turbo Coded MIMO-OFDM Systems," Submitted to the IEEE Trans. on Commun., 2004, pp. 1-24.
J. McDonough, D. Raub, M. Wolfel, and A. Waibel, "Towards Adaptive Hidden Markov Model Beamformers," IEEE Trans. on Speech and Audio Process, 2004, pp. 1-11.
K. J. Kim, T. Reid, and R. A. Iltis, "Data Detection and Soft-Kalman Filter based Semi-Blind Channel Estimation Algorithms for MIMO-OFDM Systems," IEEE 2005, pp. 2488-2492.
D. Hocevar, "LDPC Code Construction with Flexible Hardware Implementation," IEEE 2003, pp. 2708-2712.
Stephan ten Brink, "Convergence Behaviour of Iteratively Decoded Parallel Concatenated Codes," IEEE Trans. on Commun., Oct. 2001, vol. 49, pp. 1727-1737.
R. G. Gallager, "Low-Density Parity-Check Codes,", IRE Trans. on Inform. Theory, Jan. 1962, pp. 21-28.

(Continued)

*Primary Examiner* — Esaw Abraham
(74) *Attorney, Agent, or Firm* — Harrington & Smith

(57) ABSTRACT

Disclosed is an apparatus having a detector for an iterative LDPC-coded MIMO-OFDM system, where the detector is configured to use a structured irregular LDPC code in conjunction with a belief propagation algorithm. Also disclosed is an apparatus having a detector for a structured irregular LDPC-coded MIMO-OFDM system, where the detector is configured to use an iterative Recursive Least Squares-based data detection and channel estimation technique. Corresponding methods and computer program products are also disclosed.

13 Claims, 4 Drawing Sheets

OTHER PUBLICATIONS

B. Vasic and O. Milenkovic, "Combinatorial Constructions of Low-Density-Parity-Check-Codes for Iterative Decoding", IEEE Trans. On Inform. Theory, vol. 50, Jun. 2004, pp. 1156-1176.

V. Stolpman, J. Zhang, and N. W. Vaes, "Irregular Structured LDPC Codes," Proposal for IEEE 802.16 Broadband Wireless Access Working Group, 2004, 7 pgs.

M. Mansour and N. Shanbhag, "High-Throughput LDPC Decoders", IEEE Trans. on Very Large Scale Integration System, vol. 11, Dec. 2003, pp. 976-996.

M. Tuchler, A.C. Singer, and R. Koetter, "Minimum Mean Squared Error Equalization Using A Priori Information", IEEE Trans. on Signal Processing, vol. 50, Mar. 2002, pp. 673-683.

K. J. Kim, T. Reid, and R. A. Iltis, "Soft Data Detection Algorithm for an Iterative Turbo Coded MIMO OFDM Systems," in Proceedings of the Asilomar Conference on Signals Systems and Computers, (Pacific Grove, CA), Nov. 2004, pp. 1193-1197.

Lu et al., "Performance Analysis and Design Optimization of LDPC-Coded MIMO OFDM Systems", IEEE Transactions on Signal Processing, vol. 52, No. 2, (Feb. 2004), (pp. 348-361).

* cited by examiner

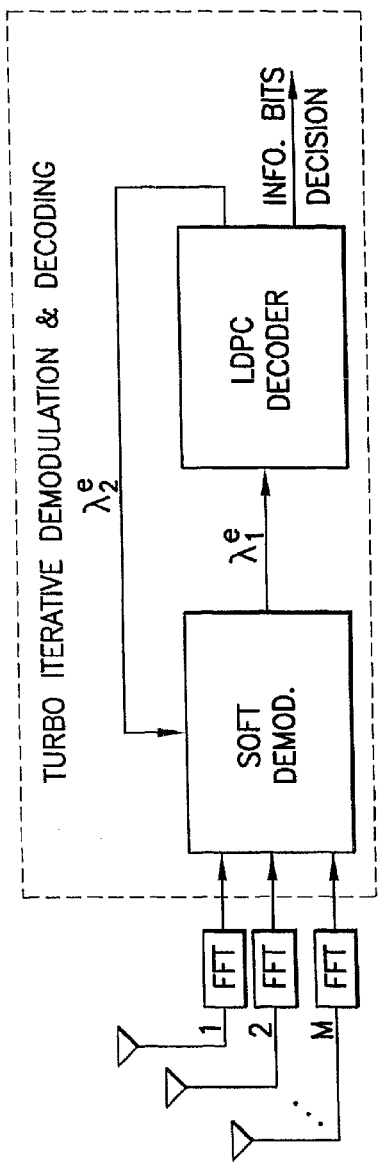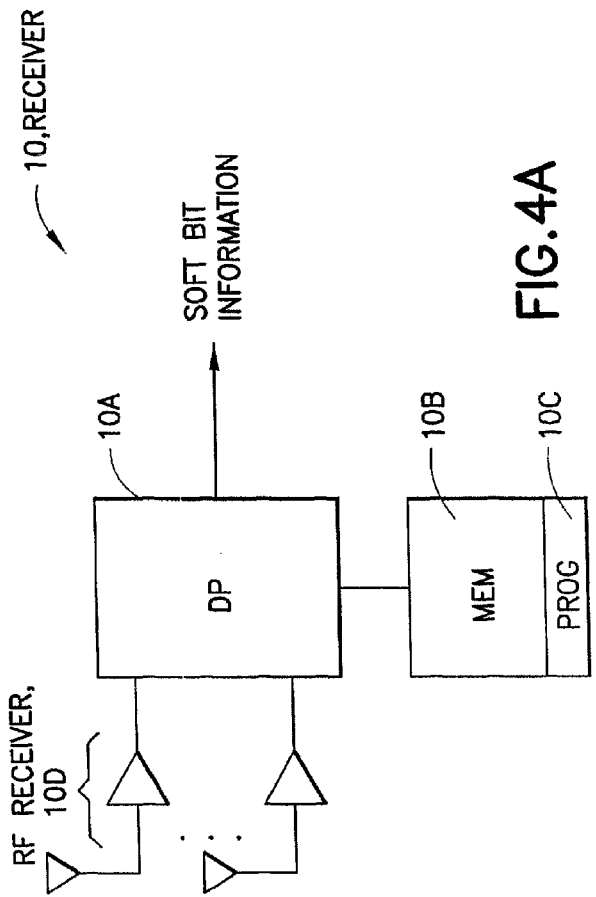

METHOD, APPARATUS AND COMPUTER PROGRAM PRODUCT PROVIDING SOFT ITERATIVE RECURSIVE LEAST SQUARES (RLS) CHANNEL ESTIMATOR

CLAIM OF PRIORITY FROM COPENDING PROVISIONAL PATENT APPLICATION

This patent application is a divisional application of U.S. application Ser. No. 11/804,239, filed May 16, 2007, now U.S. Pat. No. 8,060,803 the disclosure of which is incorporated by reference in its entirety, which claims priority under 35 USC §119(e) from U.S. Provisional Patent Application No.: 60/801,037, filed May 16, 2006, and incorporated by reference as though fully restated herein, including the various exhibits attached thereto.

FIELD OF THE INVENTION

The exemplary embodiments of this invention relate generally to wireless communication apparatus and methods and, more specifically relate to radio frequency (RF) receivers and channel estimation techniques.

BACKGROUND OF THE INVENTION

In recent years Low-Density Parity-Check (LDPC) codes [1] have gained attention with their capability to achieve near Shannon limit performance. Although LDPC codes of random construction allow for a high degree of parallelism, the randomness of the parity-check matrix makes it difficult to exploit in hardware. This disadvantage has lead to several approaches of designing structured irregular LDPC codes [2,3], that are suitable for an efficient hardware implementation, yielding very high throughput. They are designed using different methods, but the basic idea is to partition the parity-check matrix into non-overlapping block rows and block columns. One such approach is to use a permutation matrix. Under this design method, one belief propagation algorithm [4] has been proposed, where an LDPC decoding iteration is broken into sub-iterations. During each sub-iteration updated log-likelihood ratios (LLRs) are computed for each of the non-overlapping block rows.

It is shown for single-carrier systems in [5] that an iterative minimum-mean square error (MMSE) equalizer combined with soft data detector lead to both better channel estimation and BER performance. Thus, iterative estimation/detection structures based on these latter methods may also yield better BER performance in OFDM systems with unknown channels.

In the conventional RLS channel estimator, the hard decision from the data detector is used. Also, only one shot by the detector-channel estimator-decoder chain is used.

FIG. 1 herein, which reproduces FIG. 3 of Lu et al., "Performance Analysis and Design Optimization of LDPC-Coded MIMO OFDM Systems", IEEE Transactions on Signal Processing, Vol. 52, No. 2, February 2004, pps. 348-361, which was attached as Exhibit K to the above-referenced US Provisional Application and incorporated by reference therein its entirety, is illustrative of a conventional Turbo receiver structure that employs a soft demodulator and a soft LDPC decoder for an LDPC-coded Multiple-Input, Multiple Output (MIMO) Orthogonal Frequency Division Multiplex (OFDM) system.

SUMMARY

In one aspect thereof the exemplary embodiments of this invention provide a method that comprises providing a detector for an iterative LDPC-coded MIMO-OFDM system; and using a structured irregular LDPC code in conjunction with a belief propagation algorithm.

In another aspect thereof the exemplary embodiments of this invention provide a method that comprises providing a detector for a structured irregular LDPC-coded MIMO-OFDM system; and using an iterative Recursive Least Squares-based data detection and channel estimation technique for the structured irregular LDPC-coded MIMO-OFDM system.

In another aspect thereof the exemplary embodiments of this invention provide an apparatus that comprises a detector for an iterative LDPC-coded MIMO-OFDM system, where the detector is configured to use a structured irregular LDPC code in conjunction with a belief propagation algorithm.

In another aspect thereof the exemplary embodiments of this invention provide an apparatus that comprises a detector for a structured irregular LDPC-coded MIMO-OFDM system, where the detector is configured to use an iterative Recursive Least Squares-based data detection and channel estimation technique.

In another aspect thereof the exemplary embodiments of this invention provide a computer program product that comprises instructions embodied in a tangible data storage medium, where the execution of the instructions by a data processor results in an operation of implementing a detector for an iterative LDPC-coded MIMO-OFDM system that uses a structured irregular LDPC code in conjunction with a belief propagation algorithm.

In another aspect thereof the exemplary embodiments of this invention provide a computer program product that comprises instructions embodied in a tangible data storage medium, where the execution of the instructions by a data processor results in an operation of implementing a detector for a structured irregular LDPC-coded MIMO-OFDM system that uses an iterative Recursive Least Squares-based data detection and channel estimation technique.

In another aspect thereof the exemplary embodiments of this invention provide a detector configured for an iterative LDPC-coded MIMO-OFDM system, where the detector comprises means for using a structured irregular LDPC code in conjunction with a belief propagation algorithm.

In a further aspect thereof the exemplary embodiments of this invention provide a detector configured for a structured irregular LDPC-coded MIMO-OFDM system, where the detector comprises means for using an iterative Recursive Least Squares-based data detection and channel estimation technique.

BRIEF DESCRIPTION OF THE DRAWINGS

The description of the exemplary embodiments of this invention is intended to be read in conjunction with the attached drawing figures, wherein:

FIG. 1 shows a conventional Turbo receiver structure that employs a soft demodulator and a soft LDPC decoder for an LDPC-coded MIMO OFDM system.

FIG. 4A is a simplified block diagram of a receiver that is constructed and operated in accordance with the exemplary embodiments of this invention.

DETAILED DESCRIPTION OF THE EXEMPLARY EMBODIMENTS

Figure 2:
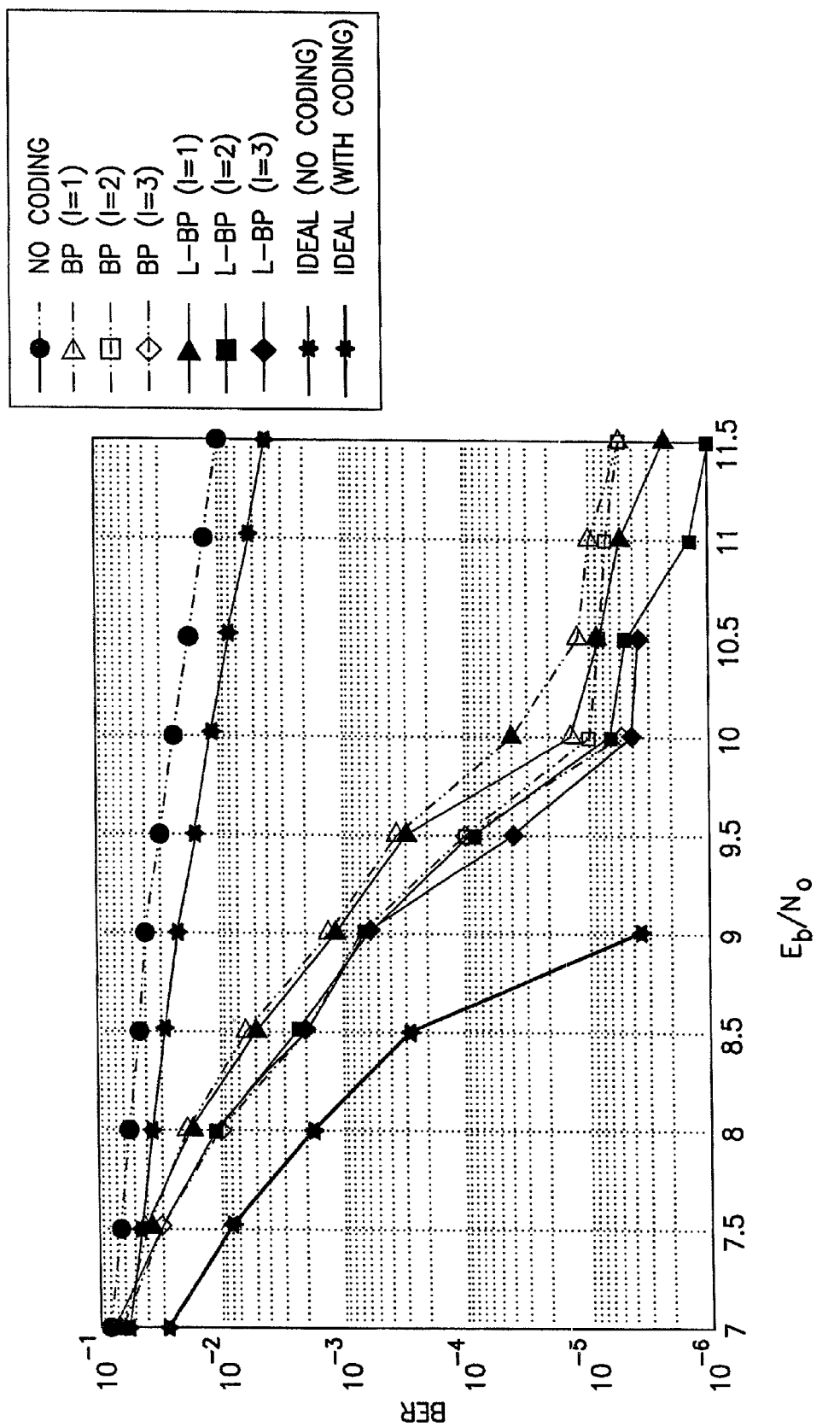
FIG. 2 is a graph of Bit Error Rate (BER) performance of the detector in the iterative LDPC coded MIMO-OFDM system with belief-propagation (BP) and layered belief-propagation (L-BP) algorithms.

Evaluated herein is the performance of a receiver employing an iterative RLS-based (Recursive Least Squares-based) data detection and channel estimation technique for a structured irregular LDPC coded MIMO-OFDM system. Using an EXIT chart analysis, the performance of the detector with various approximate decoding algorithms is analyzed.

The exemplary embodiments of this invention provide a soft-RLS OFDM channel estimator that may be combined with a MIMO-OFDM soft-QRD-M data detector [6, 7] to develop a novel semi-blind channel estimation and data detection algorithm, method, apparatus and computer program product.

For a quasi-static channel (one that changes slowly), a RLS channel estimator can be used over an interval of a data packet. In this conventional approach, however, the data detector is separated and its final hard decision is used. This conventional structure is not suitable when it is desired to combine soft-information from a soft data detector. Also, with a channel decoder such as Turbo decoder, and a receiver LDPC decoder, an iterative structure is needed to improve the overall receiver performance as the detector-channel estimator-decoder iteration proceeds.

The exemplary embodiments of this invention pertain at least in part to an iterative soft-RLS channel estimator that combines a soft-data detector and a channel decoder, which generates extrinsic information.

The exemplary embodiments of this invention pertain at least in part to changing a minimization function coupled with the soft-data information from the data detector, to considering the iteration of the detector-channel estimator-decoder chain, and to combining a soft-data detector and a channel decoder in a receiver to achieve enhanced performance, where the complexity may be of the same order as conventional approaches.

As will become apparent below, structured LDPC codes are described, as is a signal model. The exemplary embodiments of the soft-RLS channel estimator are also described, followed by a derivation of the EXIT chart for the MIMO data detector for an iterative LDPC coded MIMO-OFDM system. Simulation results are also discussed.

Structured Low-Density Parity-Check Codes

In the ensuing description the symbol □ placed over an equals sign (=) should be interpreted as the symbol delta (Δ).

Considered herein is a baseband model for a received MIMO OFDM signal over a multipath fading channel. The notation used for the MIMO-OFDM system includes the following:

$N_f, N_t, N_r$: number of multipaths and antennas in transmitter and receiver.

K, N: number of subcarriers and OFDM data symbols in one packet.

$T_g, T_d \stackrel{\Box}{=} KT_s, T_s$:

guard time interval, OFDM data symbol interval, and sampling time.

A, a, $(A)_{l,m}$, $(a)_k$: a matrix, a vector, the (l,m) element of the matrix A, and the k-th element of the vector a.

$\Lambda(a_1, \ldots, a_N)$: a diagonal matrix with $\{a_1, \ldots, a_N\}$.

The symbols p, q, k, n are used as indices for the transmit antenna, receiver antenna, subcarrier, and OFDM data symbol respectively, with $1 \leq p \leq N_t$, $1 \leq q \leq N_r$, $1 \leq k \leq K$, $0 \leq n \leq N$.

LDPC codes can be constructed in many different ways. A completely random construction generally yields a very high performance LDPC codes, however they are not suitable for implementation. Some of the structured approaches yield a practical implementation, highly reconfigurable and high throughput LDPC code, with a slight performance degradation. While randomness is a desired property in the parity-check matrix, recently many researchers have shown that high performance LDPC codes can be constructed with a structured approach. One such approach is to build an irregular LDPC code based on shifted permutation matrices [2, 3].

Signal Model for LDPC-MIMO-OFDM Systems

The coded bit stream is converted into $N_t$ parallel data substreams by serial-to-parallel processing. One packet is composed of N OFDM data symbols where each of the data symbols is made up of K subcarriers. A guard time interval $T_g$ is also included in each data symbol to eliminate ISI. The coded symbols $\{d_k^p(n)\}$ drive the p-th modulator, a K-point IFFT. The coded symbols $d_k^p(n)$ are chosen from a complex-valued finite alphabet, that is, $d_k^p(n)=g(b_{k,1}^p(n), \ldots, b_{k,Q}^p(n))$: $\{-1,1\}^Q \rightarrow C$, where $b_{k,j}^p \in \{-1,1\}$ is understood to implicitly map to $\{1,0\}$ if required for decoding. The n-th output of the p-th modulator is $$s^p(t) = s_D^p(t)p_D(t - T_d^g(n)),$$

$$s_D^p(t) = \frac{1}{\sqrt{K}} \sum_{k=0}^{K-1} d_k^p(n) e^{j2\pi k(t-T_d^g(n))/T_d}.$$

Here, $$T_d^g \stackrel{\Box}{=} (T_g + T_d)$$

and $p_D(t)$ is a pulse with finite support on $[0,T_d]$. The channel between the p-th transmit and q-th receiver antenna, $\{f_l^{p,q}(n)\}$, is modeled by a tapped delay line, such that the n-th received signal at the q-th antenna is $r^q(t)=\sum_{p=1}^{N_t}\sum_{l=0}^{N_f-1} f_l^{p,q}(n)s_D^p(n)s_D^p(t-lT_s)+n^q(t)$. It is assumed in the sequel that $N_f T_s < T_g$, a set of channels $\{f_l^{p,q}(n)\}$ is assumed to be constant over only one OFDM packet duration, and the receiver is assumed to be matched to the transmitted pulse. The additive noise $n^q(t)$ is circular white Gaussian with spectral density $2N_0$. The demodulator vector output of the n-th OFDM symbol after eliminating the guard interval is $$y^q(n)=[D^1(n)C^T, \ldots, D^{N_t}(n)C^T]f^q(n)+z^q(n), \quad (1)$$

where $$y_k^q(n) = \sum_{p=1}^{N_t} F_k^{p,q}(n)d_k^p(n) + z_k^q(n), \quad (2)$$

$$y^q(n) \stackrel{\Box}{=} [y_0^q(n), \ldots, y_{K-1}^q(n)]^T,$$

$$D^p(n) \stackrel{\Box}{=} \Lambda(d_0^p(n), \ldots, d_{K-1}^p(n)), C \stackrel{\Box}{=} [c_0, \ldots, c_{K-1}],$$

$$c_k \stackrel{\Box}{=} [1, e^{-j2\pi k/K}, \ldots, e^{-j2\pi k(N_f-1)/K}]^T,$$

$$f^q(n) \stackrel{\Box}{=} [f^{1,q}(n)^T, \ldots, f^{N_t,q}(n)^T]^T,$$

-continued $$f^{p,q}(n) \stackrel{\Delta}{=} [f_0^{p,q}(n), \ldots, f_{N_f-1}^{p,q}(n)]^T, F_k^{p,q}(n) \stackrel{\Delta}{=} c_k^T f^{p,q}(n),$$

$$z^q(n) \square N(z^q(n); 0, 2N_0/T_s I_{K \times K}).$$

Soft-RLS Channel Estimator

For a received vector $$y_k(n) \stackrel{\Delta}{=} [y_k^1(n), \ldots, y_k^{N_r}(n)]^T$$

on subcarrier k, the a posteriori probability (APP) for $b_{k,j}^p(n)$ is $$L(b_{k,j}^p(n)) \stackrel{\Delta}{=} \ln \frac{p(b_{k,j}^p(n) = 1 \mid y_k(n))}{p(b_{k,j}^p(n) = -1 \mid y_k(n))}. \quad (3)$$

The soft-RLS estimator is driven by the soft decision $$\bar{d}_k^p(n) \stackrel{\Delta}{=} E[d_k^p(n)],$$

where the expectation is with respect to the APP. Conditioned on the soft symbol decisions, the measurement vector used by the q-th soft-RLS estimator is $$y^q(n) = H(\bar{D}(n))f^q(n) + H(\tilde{D}(n))f^q(n) + z^q(n). \quad (4)$$

In (4) $\tilde{D}^p(n) = D^p(n) - \bar{D}^p(n)$, and $$H(\bar{D}(n)) \stackrel{\Delta}{=} [\bar{D}^1(n)C^T, \ldots, \bar{D}^{N_t}(n)C^T],$$

$$\bar{D}^p(n) \stackrel{\Delta}{=} \Lambda(\bar{d}_0^p(n), \ldots, \bar{d}_{K-1}^p(n)).$$

To develop the soft-RLS estimator, first rewrite the received vector signal using a composite noise vector including the data detection errors, $$y^q(n) = H(\bar{D}(n))f^q(n) + \tilde{z}^q(n), \quad (5)$$

where $$\tilde{z}^q(n) \stackrel{\Delta}{=} \sum_{p=1}^{N_t} \tilde{D}^p(n) C^T f^{p,q}(n) + z^q(n).$$

Considering the statistical property of $\tilde{z}^q(n)$, change the minimizing function applying an approach used in, for example, [8]. The soft-RLS algorithm is obtained by recursive minimization:

$$\hat{f}^q(n) = \arg\min_{f^q(n)} \sum_{m=1}^n \beta^{n-l}(\delta^q(m))^H (\tilde{R}^q(m))^{-1} \delta^q(m). \quad (6)$$

Here, $$\delta^q(m) \stackrel{\Delta}{=} y^q(m) - H(\bar{D}(m))f^q(n)$$

and β is a forgetting factor. Denoting by $V(d_k^p(m))$ the variance of symbol $d_k^p(m)$ and by $$e_{k+1} \stackrel{\Delta}{=} [0_{1 \times k}, 1, 0_{1 \times (K-k-1)}]^T,$$

the covariance matrix [9] of $\tilde{z}^q(m)$ will be $\tilde{R}^q(m) = \tilde{R}_f^q(m) + 2N_0/T_s I$, where $$\tilde{R}_f^q(m) \stackrel{\Delta}{=} \sum_{p=1}^{N_t} \sum_{k=0}^{K-1} S_{k+1}(f^{p,q}(m)) V(d_k^p(m)) e_{k+1} e_{k+1}^T,$$

$$S_k(f^{p,q}(m)) \stackrel{\Delta}{=} \begin{bmatrix} 0_{1 \times k-1} \\ (C^T E[f^{p,q}(m) f^{p,q}(m)^H] C^*)(l,:) \\ 0_{1 \times K-k} \end{bmatrix}.$$

Performing some computations, the following soft-RLS algorithm at the l-th receiver subiteration is obtained:

$$P^{q,l}(n)^{-1} = \beta P^{q,l}(n-1)^{-1} + H(\bar{D}^l(n))^H (\hat{\tilde{R}}^{q,l}(n))^{-1} H(\bar{D}^l(n)),$$

$$\hat{f}^{q,l}(n) = \hat{f}^{q,l}(n-1) + P^{q,l}(n) H(\bar{D}^l(n))^H (\hat{\tilde{R}}^{q,l}(n))^{-1} \delta y^{q,l}(n),$$

$$\delta y^{q,l}(n) \stackrel{\Delta}{=} y^q(n) - H(\bar{D}^l(n)) \hat{f}^{q,l}(n-1).$$

The matrix $P^q(n)$ corresponds to the pseudocovariance. At receiver subiteration l, the iterative RLS algorithm approximates the unknown covariance $\hat{\tilde{R}}_f^{q,l}(n)$ by incorporating a previous channel estimate and APP based soft decisions, that is, $$\hat{\tilde{R}}_f^{q,l}(n) \approx \sum_{p=1}^{N_t} \sum_{k=0}^{K-1} S_{k+1}(\hat{f}^{p,q,l}(n-1)) V(d_k^p(n)) e_{k+1} e_{k+1}^T.$$

EXIT Chart for the Iterative LDPC coded MIMO-OFDM System

At receiver subiteration l, the soft-QRD-M algorithm [6, 7] is run on all subcarriers based on the following approximate measurement model derived from all $N_r$ receive antennas:

$$y_k(n) \approx \hat{F}_k^l(n) d_k(n) + z_k(n), \quad (7)$$

where $$(\hat{F}_k^l(n))_{i,j} \stackrel{\Delta}{=} c_k^T (\hat{f}^{i,l}(n))_j, d_k(n) \stackrel{\Delta}{=} [d_k^1(n), \ldots, d_k^{N_t}(n)], \quad (8)$$

$$z_k(n) \square N(z_k(n); 0, 2N_0/T_s I_{N_r \times N_r}).$$

Here, $\hat{F}_k^l(n)$ represents estimated frequency responses of all $N_r \times N_t$ channels at frequency k and receiver subiteration l. The soft-QRD-M, with $N_r \geq N_t$, computes approximates APPs. The soft decisions at iteration l, $\bar{d}_k^{p,l}$ are obtained from the APPs using channel estimations $\hat{F}_k^l(n)$, such that $$\bar{d}_k^{p,l}(n) = g(\tan h(L^l(b_{k,1}(n))/2), \ldots, \tan h(L^l(b_{k,Q}^p(n)/2))),\quad (5)$$

where $$L^l(b_{k,j}^p(n)) \approx \ln \frac{p(y_k(n) \mid \hat{F}_k^l(n), b_{k,j}^p = 1)}{p(y_k(n) \mid \hat{F}_k^l(n), b_{k,j}^p = -1)} + \lambda_2^l(b_{k,j}^p). \quad (9)$$

The prior APP $\lambda_2^l(b_{k,j}^p)$ is the extrinsic from the LDPC decoder. The extrinsic decoder information, denoted by $\lambda_2^l(b_{k,j}^p)$ becomes increasingly accurate as long as the SNR is above a threshold or the receiver subiteration proceeds. The LDPC decoder computes the APPs of the coded bits using the interleaved extrinsic bit information from the soft QRD-M, and then excludes a priori information to generate a new extrinsic as $$\lambda_2^{\Pi^{-1},l}(b_{k,j}^p) = L_2^l(b_{k,j}^p) - \lambda_1^{\Pi^{-1},l}(b_{k,j}^p). \quad (10)$$

In (10), $\lambda_1^{\Pi^{-1},l}(b_{k,j}^p)$ is a deinterleaved $\lambda_1^l(b_{k,j}^p)$. On the next iteration, the soft-QRD-M uses the interleaved version of the a priori LLR, $\lambda_2^l(b_{k,j}^p)$. Specifically, the new APP from the decoder $\lambda_2^l(b_{k,j}^p)$ is added to the measurement LLR. Thus, the decoder extrinsic improves detector performance by providing more reliable data decisions.

LDPC Decoding Algorithms

In the conventional belief propagation algorithm or SPA [1], the extrinsic information is iteratively calculated from each check node to the participating bit nodes and from each bit node to check nodes. To speed up decoding process, a variation of the belief propagation algorithm, called the layered belief propagation algorithm, has been proposed in [10], where the extrinsic information are updated after each layer is processed. The extrinsic information sent to the LDPC decoder is determined by the LLRs by $$\lambda_1^l(b_{k,j}^p) = \hat{L}^l(b_{k,j}^p(n)) - \lambda_2^l(b_{k,j}^p), \quad (11)$$

where $\hat{L}^l(b_{k,j}^p(n))$ is an approximated LLRs and the a priori LLR of the coded bit $b_{k,j}^p(n)$ corresponds to the interleaved extrinsic information from the previous decoding iteration. To investigate the convergence behavior of the proposed iterative receiver structure with a different decoding algorithm, the EXIT chart analysis may be used.

EXIT Chart Analysis

The EXIT chart analysis was originally developed in [11] to analyze iterative Turbo decoding performance without extensive BER simulations. Here, we apply a modified EXIT technique to evaluate the LDPC decoding/soft-QRD-M algorithm defined by iterations (10) and (11). The extrinsic information $I_E^m(b_{k,j}^p)$ at the soft-QRD-M output will be plotted versus the a priori information $I_A^m(b_{k,j}^p)$ corresponding to the overall LDPC decoder extrinsic information. Compared to [11], employed are simulations to generate the actual priors $\lambda_2(b)$ from the LDPC decoder, hence a Gaussian approximation is not required. Let $I_A(b_{k,j}^p) = I(\lambda_2(b_{k,j}^p); b_{k,j}^p)$ be the mutual information between the a priori information and bit $b^p(k,j)$. A Monte-Carlo simulation over $N_e$ runs is used to estimate $I_A(bf_{k,j}^p)$ as follows [7]:

$$\hat{I}_A(b_{k,j}^p) \approx \frac{1}{N_e} \sum_{l=1}^{N_e} I_{A,l}(b_{k,j}^p) = 1 + \frac{1}{N_e} \sum_{l=1}^{N_e} [\Delta_l^1 + \Delta_l^2], $$

where $$\Delta_l^1 \triangleq \frac{1}{1+\delta_l} \log_2\left(\frac{1}{1+\delta_l}\right), \Delta_l^2 \triangleq \frac{\delta_l}{1+\delta_l} \log_2\left(\frac{\delta_l}{1+\delta_l}\right), \quad (12)$$

$$\delta_l \triangleq \delta(l, p, k, j) \triangleq e^{\lambda_{2,l}(b_{k,j}^p)},$$

where $\lambda_{2,l}(b_{k,j}^p)$ is the LDPC decoder output extrinsic LLR. Similarly, the mutual information between the soft-QRD-M output extrinsic LLRs $\lambda_1(b_{k,j}^p)$ and the information bit $b_{k,j}^p$, $I_E(b_{k,j}^p) = I(\lambda_2(b_{k,j}^p); b_{k,j}^p)$, is estimated. These Monte-Carlo estimates are consistent by the strong Law of Large Numbers for $N_e$ independent trials, so $\hat{I}_A(b_{k,j}^p) \to I_A(b_{k,j}^p)$. The soft-QRD-M detector starts with zero a priori information, that is, $I_A^0(b_{k,j}^p) = 0$. On iteration m, the trajectory point is defined by $(\hat{I}_A^m(b_{k,j}^p), \hat{I}_E^m(b_{k,j}^p))$. An estimate of $\hat{I}_E^m(b_{k,j}^p) = T(\hat{I}_A^m(b_{k,j}^p))$ is also available. The iterative detector/decoder evolves as long as $\hat{I}_E^{m+1}(b_{k,j}^p) > \hat{I}_E^m(b_{k,j}^p)$. Note that since the detector has no coding gain, the data detector extrinsic information $\hat{I}_E^m$ is typically less than unity. However, at a sufficiently high SNR the LDPC decoder extrinsic information can reach unity.

Simulation Results

The following parameters were used in the simulations.
$K=64$, $N_t=N_r=4$, $N_H=6144$, $K_H=4608$.
Fading channel powers, $N_f=2$, $\|f^{p,q}(n)\|^2 = \{0.5991, 0.4009\}$, $\forall p,q$.

The following seed matrix $H_S$ in hexadecimal format [3] with $N_s=128$, $p=53$ is used to generate H matrix.

$$H_S = [H_{S,1}, H_{S,2}]^T,$$

$$H_{S,1}^T \triangleq \begin{bmatrix} 0x8013065040EF \\ 0x006306D40A25 \\ 0x00C792C82502 \\ 0x018B61B04422 \\ 0x0303C2BD1020 \\ 0x060051D2D310 \end{bmatrix},$$

$$H_{S,2}^T \triangleq \begin{bmatrix} 0x0C030A1B48B0 \\ 0x18031AF05028 \\ 0x30152AC0EC00 \\ 0x600806D64168 \\ 0xC00F2141C0A4 \\ 0x003282D06271 \end{bmatrix}.$$

Figure 3:
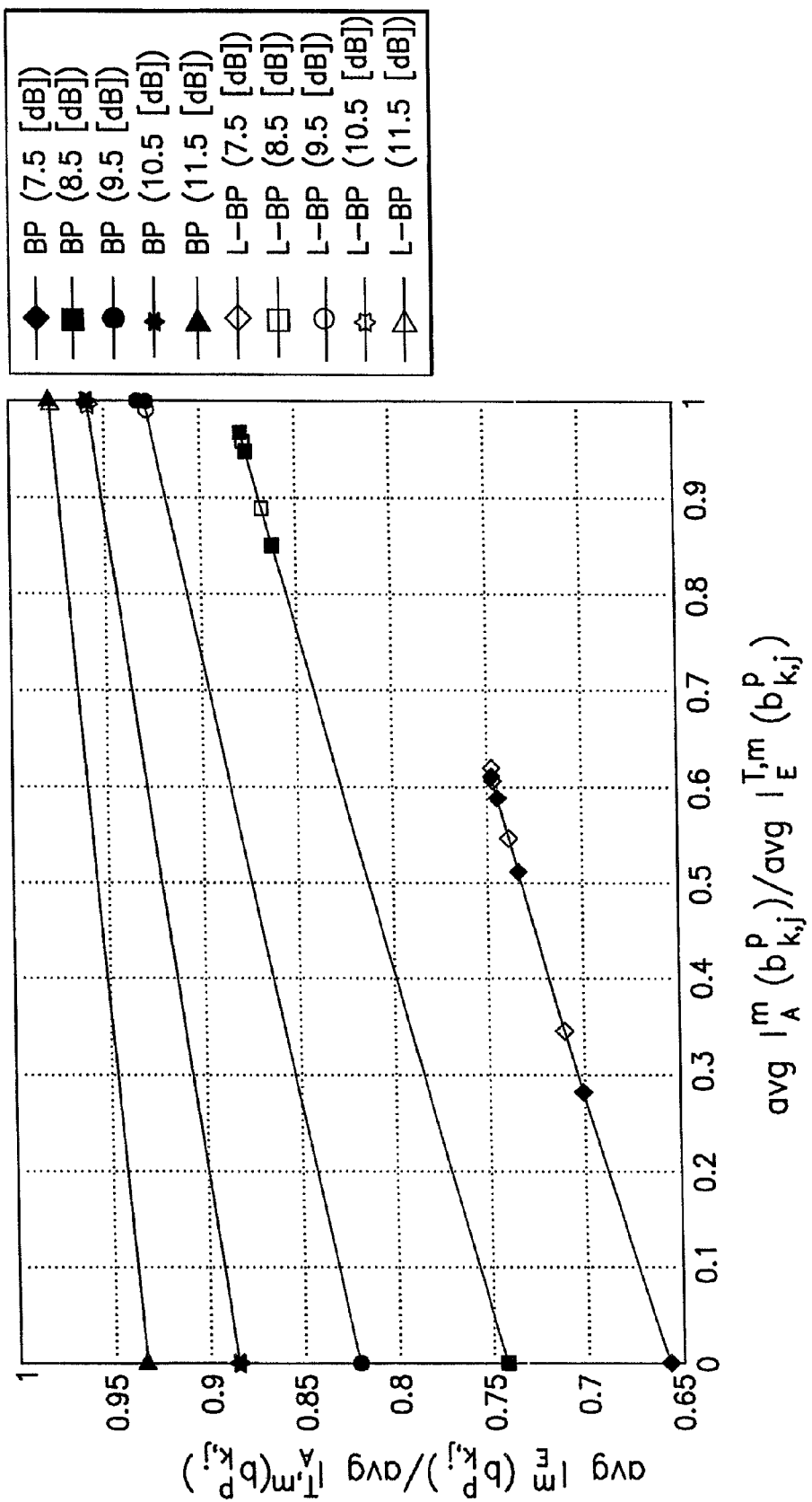
FIG. 3 shows an EXIT chart for the data detector employing a decoding algorithm at a different Signal-to-Noise Ratio (SNR).

The QPSK is used for a subcarrier modulation, and as a decoding algorithm belief-propagation (BP) and layered belief-propagation (L-BP) algorithms are used. Twelve LDPC iterations are used in these algorithms. Bit error rate (BER) performances of the detector employing a different decoding algorithm are shown in FIG. 2. This Figure shows that as detector-decoder iteration proceeds, the data detector works better. Compared to the BP algorithm, we have a better BER performance with the L-BP algorithm. If the number of detector-decoder iterations larger than two, the BER performance tends to be independent in mid-SNR ranges, and one may observe a difference in higher SNR ranges. Compared to the ideal receiver, there is at most 1 [dB] SNR loss within three detector-channel estimator-decoder iterations. FIG. 3 is the corresponding EXIT chart at a different SNR employing the proposed soft-RLS channel estimator. This Figure shows that although there are BER differences between decoding algorithms, corresponding noticeable differences in terms of the mutual information as SNR increases are not observed. Also, with only one or two detector-decoder iterations, the detector may be typically trapped in a pinch-off region in higher SNRs. In lower SNRs, the L-BP algorithm leads to the pinch-off region faster than the BP algorithm.

Reference is made to FIG. 4A for illustrating a simplified block diagram of a receiver 10 that is suitable for use in practicing the exemplary embodiments of this invention. The receiver 10 may include a data processor (DP) 10A, a memory (MEM) 10B that stores a program (PROG) 10C, and a suitable radio frequency (RF) receiver 10D for receiving a wireless communication from a transmitter, typically via a plurality of antennas.

In general, the various embodiments in which the receiver 10 can be implemented can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The exemplary embodiments of this invention may be implemented by computer software (PROG 10C) executable by the DP 10A of the receiver 10, or by hardware, or by a combination of software and hardware, as well as firmware.

The MEM 10B may be of any type suitable to the local technical environment and may be implemented using any suitable data storage technology, such as semiconductor-based memory devices, magnetic memory devices and systems, optical memory devices and systems, fixed memory and removable memory. The DP 10A may be of any type suitable to the local technical environment, and may include one or more of general purpose computers, special purpose computers, microprocessors, digital signal processors (DSPs) and processors based on a multi-core processor architecture, as non-limiting examples.

Figure 4B:
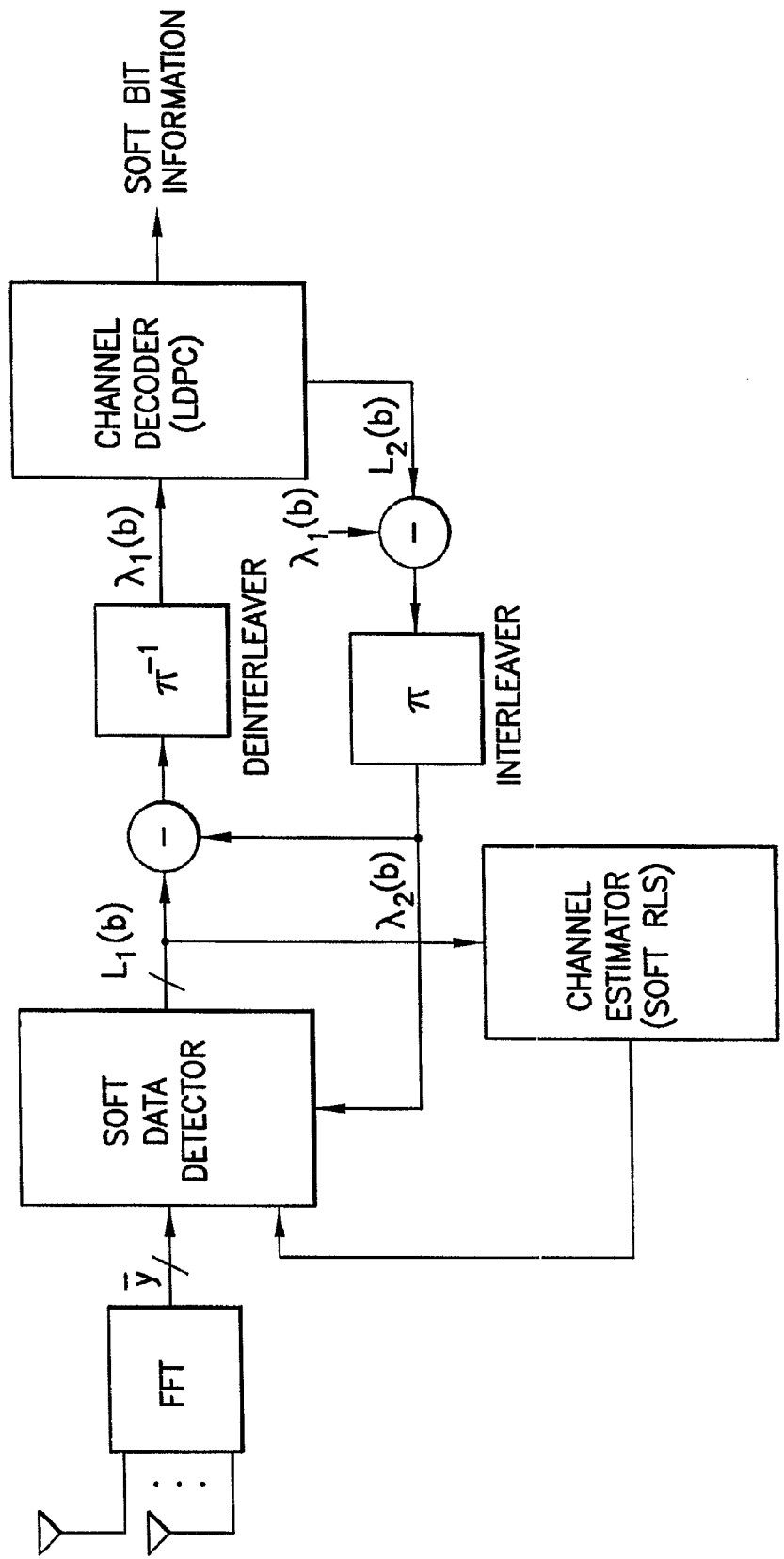
FIG. 4B is another block diagram of the receiver that is constructed and operated in accordance with the exemplary embodiments of this invention.

Reference is made to FIG. 4B for illustrating another, more detailed block diagram of an exemplary embodiment of the receiver 10. In this diagram one may see the loop between the soft data detector and the channel estimator. The output of the soft data detector is used in the soft RLS in terms of the soft information, as opposed to the conventional approach that uses hard information from the data detector. In accordance with this architecture the receiver 10 can communicate through the use of soft information.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. In general, any functional blocks, apparatus, systems, techniques or methods described herein may be implemented in, as non-limiting examples, hardware, software, firmware, special purpose circuits or logic, general purpose hardware or controller or other computing devices, or some combination thereof.

The exemplary embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As may be appreciated, in the foregoing there have been described methods, apparatus, computer program products and devices, including integrated circuits, that provide a detector for an iterative LDPC-coded MIMO-OFDM system, wherein a structured irregular LDPC code is used in conjunction with a belief propagation algorithm, such as a layered belief propagation algorithm.

As may be further appreciated, in the foregoing there have been described methods, apparatus, computer program products and devices, such as integrated circuits, that provide an iterative Recursive Least Squares-based data detection and channel estimation technique for a structured irregular LDPC coded MIMO-OFDM system.

As may be further appreciated, in the foregoing there have been described methods, apparatus, computer program products and devices, such as integrated circuits, that provide an iterative RLS channel estimator that is suitable for use over a quasi-static channel, where the channel may change slowly due to, for example, a limited mobility of a mobile communication device.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

List of references referred to in the foregoing description:
[1] R. G. Gallager, "Low-Density Parity-Check Codes," IRE Trans. on Inform. Theory, pp. 21-28, January 1962, which was attached as Exhibit A to the above-referenced US Provisional Application and incorporated by reference therein its entirety.
[2] B. Vasic and O. Milenkovic, "Combinatorial constructions of Low-Density-Parity-Check-Codes for iterative decoding," IEEE Trans. on Inform. Theory, vol. 50, pp. 1156-1176, June 2004, which was attached as Exhibit B to the above-referenced US Provisional Application and incorporated by reference therein its entirety.
[3] V. Stolpman, J. Zhang, and N. W. Vaes, "Irregular structured LDPC codes," Proposal for IEEE 802.16 Broadband Wireless Access Working Group, 2004, which was attached as Exhibit C to the above-referenced US Provisional Application and incorporated by reference therein its entirety.
[4] M. Mansour and N. Shanbhag, "High-throughput LDPC decoders," IEEE Trans. on Very Large Scale Integration System, vol. 11, pp. 976-996, December 2003, which was attached as Exhibit D to the above-referenced US Provisional Application and incorporated by reference therein its entirety.

[5] M. Tuchler, A. C. Singer, and R. Koetter, "Minimum mean squared error equalization using a priori information," IEEE Trans. on Signal Processing, vol. 50, pp. 673-683, March 2002, which was attached as Exhibit E to the above-referenced US Provisional Application and incorporated by reference therein its entirety.

[6] K. J. Kim, T. Reid, and R. A. Iltis, "Soft data detection algorithm for an iterative Turbo coded MIMO OFDM systems," in Proceedings of the Asilomar Conference on Signals Systems and Computers, (Pacific Grove, Calif.), pp. 1193-1197, November 2004, which was attached as Exhibit F to the above-referenced US Provisional Application and incorporated by reference therein its entirety.

[7] K. J. Kim, T. Reid, and R. A. Iltis, "Soft iterative data detection for Turbo Coded MIMO-OFDM systems," Submitted to the IEEE Trans. on Commun., 2004, which was attached as Exhibit L to the above-referenced US Provisional Application and incorporated by reference therein its entirety.

[8] J. McDonough, D. Raub, M. Wolfel, and A. Waibel, "Towards adaptive hidden Markov model beamformers." Submitted to the IEEE Trans. on Speech and Audio Process., 2004, which was attached as Exhibit G to the above-referenced US Provisional Application and incorporated by reference therein its entirety.

[9] K. J. Kim, T. Reid, and R. A. Iltis, "Data detection and soft-Kalman filter based semi-blind channel estimation algorithms for MIMO-OFDM systems," in Proceedings of ICC, pp. 2488-2492, May 2005, which was attached as Exhibit H to the above-referenced US Provisional Application and incorporated by reference therein its entirety.

[10] D. Hocevar, "LDPC code construction with flexible hardware implementation," in Proceedings of ICC, pp. 2708-2711, May 2003, which was attached as Exhibit I to the above-referenced US Provisional Application and incorporated by reference therein its entirety.

[11] S. ten Brink, "Convergence behaviour of iteratively decoded parallel concatenated codes," IEEE Trans. on Commun., vol. 49, pp. 1727-1737, October 2001, which was attached as Exhibit J to the above-referenced US Provisional Application and incorporated by reference therein its entirety.

What is claimed is:

1. A method, comprising:
   detecting a received signal for one of a structured irregular low-density parity-check (LDPC) code multiple-input-multiple-output (MIMO) orthogonal frequency division multiplex (OFDM) system and an iterative LDPC-coded MIMO-OFDM system; and
   iteratively determining an extrinsic output for the received signal at a channel decoder based on a current a posteriori probability (APP), such that each iteration comprises:
   determining the current APP at a soft data detector based at least in part on a prior extrinsic output from the channel decoder and a soft channel estimate from an iterative Recursive Least Squares-based channel estimator, the prior extrinsic output and the soft channel estimate each determined based on a prior APP.

2. The method of claim 1, where the iterative Recursive Least Squares-based channel estimator is suitable for use over a quasi static channel.

3. The method of claim 1, wherein determining the extrinsic output comprises decoding the current APP using a belief propagation algorithm in order to generate soft bit information.

4. The method of claim 3, wherein the belief propagation algorithm is a layered belief propagation algorithm.

5. An apparatus, comprising:
   a soft data detector configured to detect a received signal for at least one of a structured irregular low-density parity-check (LDPC) coded multiple-input-multiple-output (MIMO) orthogonal frequency division multiplex (OFDM) system and an iterative LDPC-coded MIMO-OFDM system;
   an iterative Recursive Least Squares-based channel estimator configured to determine a soft channel estimate; and
   a channel decoder configured to iteratively determine an extrinsic output for the received signal based on a current a posteriori probability (APP),
   whererin for each iteration, the current APP is determined at the soft data detector based at least in part on a prior extrinsic output from the channel decoder and a soft channel estimate from the iterative Recursive Least Squares-based channel estimator, the prior extrinsic output and the soft channel estimate each determined based on a prior APP.

6. The apparatus of claim 5, where the iterative Recursive Least Squares-based channel estimator is suitable for use over a quasi static channel.

7. The apparatus of claim 5, embodied at least in part in an integrated circuit.

8. The apparatus of claim 5, wherein the channel decoder is configured to determine the extrinsic output by decoding the current APP using a belief propagation algorithm in order to generate soft bit information.

9. The apparatus of claim 8, wherein the belief propagation algorithm is a layered belief propagation algorithm.

10. A computer program product comprising instructions embodied in a tangible data storage medium, execution of the instructions by a data processor resulting in an operation of:
    detecting a received signal for one of a structured irregular low-density parity-check (LDPC) coded multiple-input-multiple-output (MIMO) orthogonal frequency division multiplex (OFDM) system and an iterative LDPC-coded MIMO-OFDM system; and
    iteratively determining an extrinsic output for the received signal at a channel decoder based on a current a posteriori probability (APP), such that each iteration comprises:
    determining the current APP at a soft data detector based at least in part on a prior extrinsic output from the channel decoder and a soft channel estimate from an iterative Recursive Least Squares-based channel estimator, the prior extrinsic output and the soft channel estimate each determined based on a prior APP.

11. The computer program product of claim 10, where the iterative Recursive Least Squares-based channel estimator is suitable for use over a quasi static channel.

12. The computer program product of claim 10, wherein determining the extrinsic output comprises decoding the current APP using a belief propagation algorithm in order to generate soft bit information.

13. The computer program product of claim 12, wherein the belief propagation algorithm is a layered belief propagation algorithm.

* * * * *